US008925189B2

(12) United States Patent
Margrave et al.

(10) Patent No.: US 8,925,189 B2
(45) Date of Patent: Jan. 6, 2015

(54) METHOD FOR ASSEMBLING AN ELECTRICAL CONNECTOR ASSEMBLY

(75) Inventors: Christopher Adrian Margrave, Warren, OH (US); William T. Madden, Solon, OH (US); Terry A. George, Salem, OH (US); Don E. Bizon, Boardman, OH (US)

(73) Assignee: Delphi Technologies, Inc., Troy, MI (US)

( * ) Notice: Subject to any disclaimer, the term of this patent is extended or adjusted under 35 U.S.C. 154(b) by 180 days.

(21) Appl. No.: 13/590,578

(22) Filed: Aug. 21, 2012

(65) Prior Publication Data

US 2014/0053402 A1 Feb. 27, 2014

(51) Int. Cl.
*H05K 3/36* (2006.01)

(52) U.S. Cl.
USPC ................ 29/830; 29/592.1; 29/835; 29/844; 361/816; 361/818; 439/79; 439/533; 439/567; 439/597

(58) Field of Classification Search
USPC ......... 29/592.1, 830, 835, 844; 361/816, 818; 439/79, 533, 567, 597, 939
See application file for complete search history.

(56) References Cited

U.S. PATENT DOCUMENTS 7,878,844 B2 * 2/2011 Weidner ........................ 439/533
8,147,272 B2 4/2012 Rhein
8,672,709 B2 * 3/2014 Dietz et al. .................... 439/545
2010/0173520 A1 7/2010 Weidner
2011/0151719 A1 6/2011 DeWitte

FOREIGN PATENT DOCUMENTS

EP 1 065 759 A2 1/2001

OTHER PUBLICATIONS

European Search Report dated Nov. 4, 2013.

* cited by examiner

*Primary Examiner* — Paul D Kim
(74) *Attorney, Agent, or Firm* — Robert J. Myers

(57) ABSTRACT

A method is provided for assembling a connector assembly to a case. The case includes an inside surface defining an inside of the case, an outside surface defining an outside of the case, and an aperture therethrough providing communication from the inside surface to the outside surface. The connector assembly includes an outer connector having a body with a passage therethrough, an electromagnetic shield, and an inner connector with a terminal therein with a conductor extending from the inner connector in electrical communication with the terminal. The method includes positioning the outer connector on the outside of the case to align the passage of the outer connector with the aperture of the case. The method also includes positioning the inner connector on the inside of the case. The method also includes inserting the inner connector into the passage of the outer connector from the inside of the case.

8 Claims, 8 Drawing Sheets

METHOD FOR ASSEMBLING AN ELECTRICAL CONNECTOR ASSEMBLY

TECHNICAL FIELD OF INVENTION

The present invention relates to an electrical connector assembly; more particularly to an electrical connector assembly with an outer connector, an a inner connector, and an electromagnetic shield between the inner connector and the outer connector and; and even more particularly to a method for assembling an electrical connector assembly with an outer connector, an a inner connector, and an electromagnetic shield between the inner connector and the outer connector.

BACKGROUND OF INVENTION

In order to pass an electrical current or signal into or out of case, it is known to provide an electrical connector assembly having an outer connector, an inner connector that is disposed at least partly within the outer connector, and an electromagnetic shield that surrounds the portion of the inner connector that is disposed within the outer connector. The inner connector includes at least one terminal with a conductor extending therefrom for connection to a device within the case, for example only, a battery pack or a printed circuit board (PCB). Typically, the conductor is a wire when the device within the case is a battery pack. The electrical connector assembly is arranged to receive a mating connector which makes electrical contact with the terminal of the inner connector. In order to secure the electrical connector assembly to the case, the outer connector, the inner connector, and the electromagnetic shield are first assembled to each other. Next, the conductor is fed through an aperture in the case from the outside of the case, and the electrical connector assembly is fixed to the outside of the case, for example, with threaded fasteners. However, when the conductor is a wire, the length of the wire can result in extended assembly times due to the time required to feed the wire through the aperture in the case. In an alternative arrangement, the conductor may be a pin terminal that is arranged to mate with an electrical contact of a PCB within the case. In this arrangement, it may be difficult and time consuming to mate the pin terminal to the electrical contact of the PCB due to the entire electrical connector assembly being fixed to the case from the outside of the case.

What is needed is an electrical connector assembly and a method for assembling the electrical connector assembly which minimizes or eliminates one or more of the shortcomings as set forth above.

SUMMARY OF THE INVENTION

Briefly described a method is provided for assembling a connector assembly to a case. The case includes an inside surface defining an inside of the case, an outside surface defining an outside of the case, and an aperture therethrough providing communication from the inside surface to the outside surface. The connector assembly includes an outer connector having a body with a passage therethrough, an electromagnetic shield, and an inner connector with a terminal therein with a conductor extending from the inner connector in electrical communication with the terminal. The method includes positioning the outer connector on the outside of the case to align the passage of the outer connector with the aperture of the case. The method also includes positioning the inner connector on the inside of the case. The method also includes inserting the inner connector into the passage of the outer connector from the inside of the case.

BRIEF DESCRIPTION OF DRAWINGS

This invention will be further described with reference to the accompanying drawings in which.

DETAILED DESCRIPTION OF INVENTION

Figure 1:
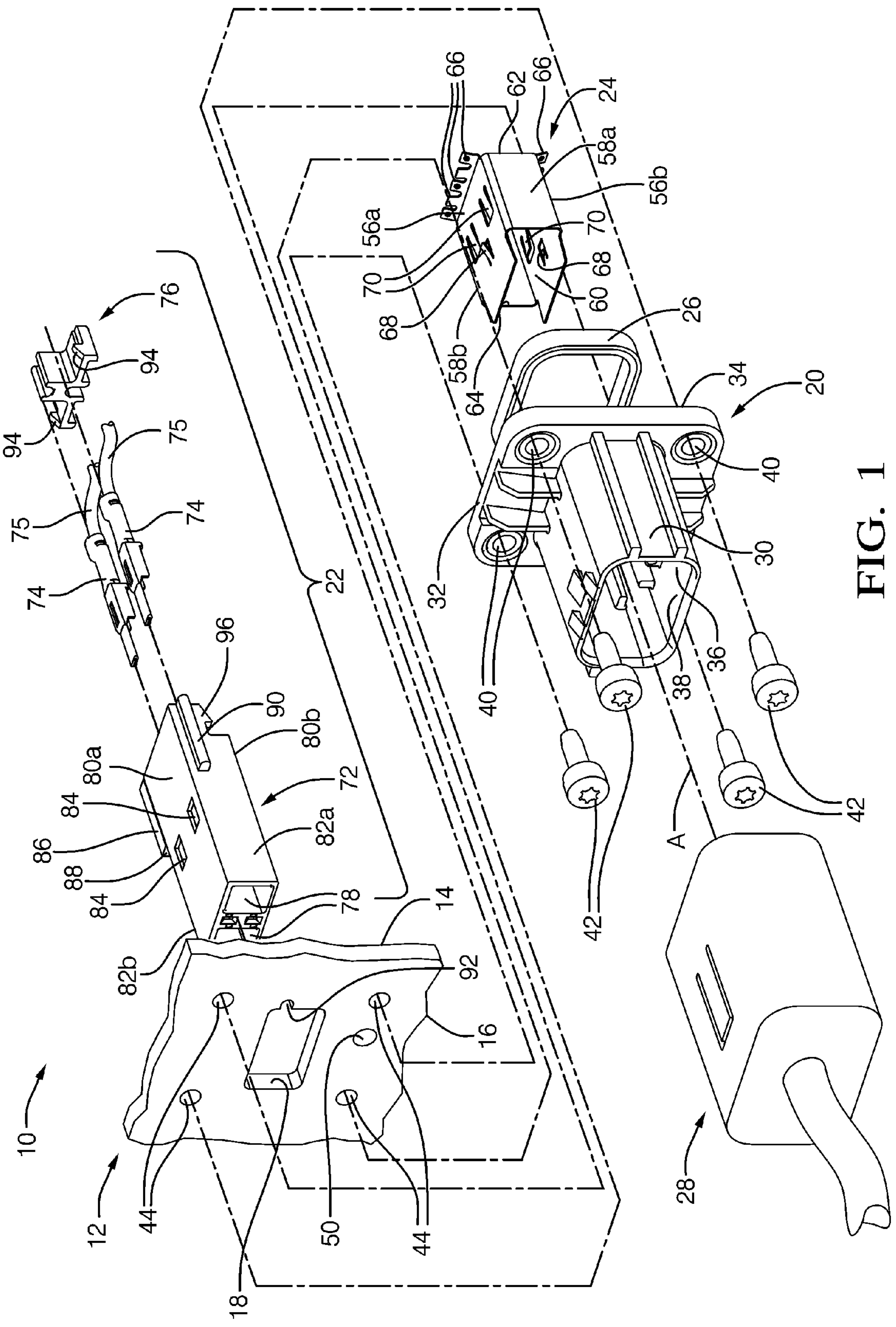
FIG. 1 is an isometric exploded view of an electrical connector assembly in accordance with a first embodiment of the present invention.
Figure 1A:
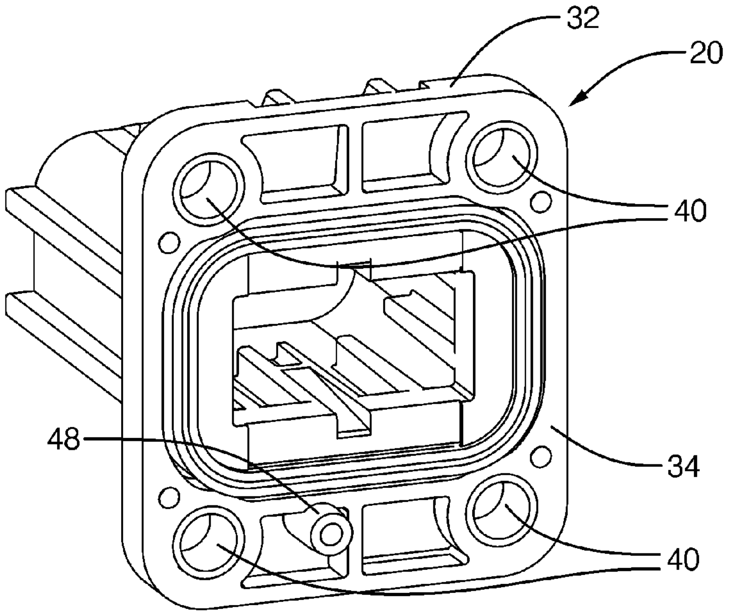
FIG. 1A is an isometric view of an outer connector of the electrical connector assembly of FIG. 1.
Figure 2:
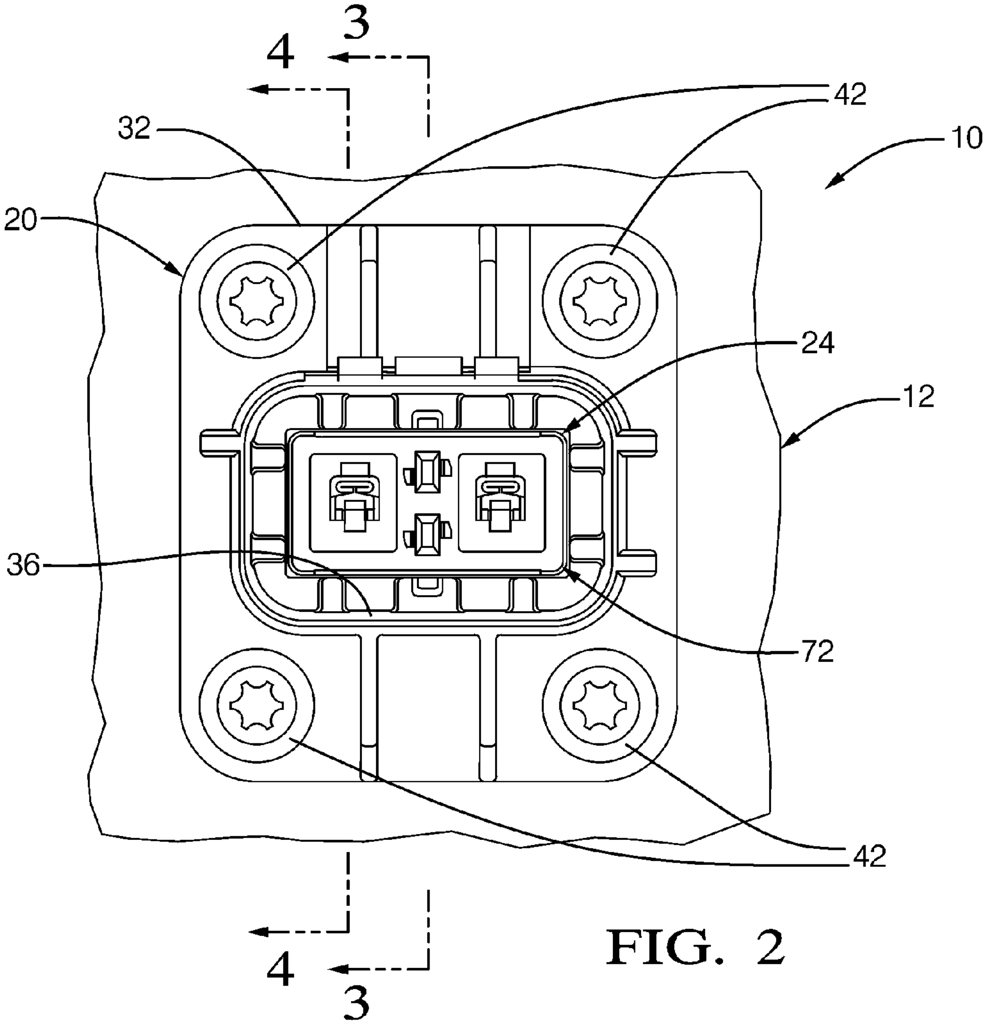
FIG. 2 is an elevation view of the electrical connector assembly of FIG. 1.
Figure 3:
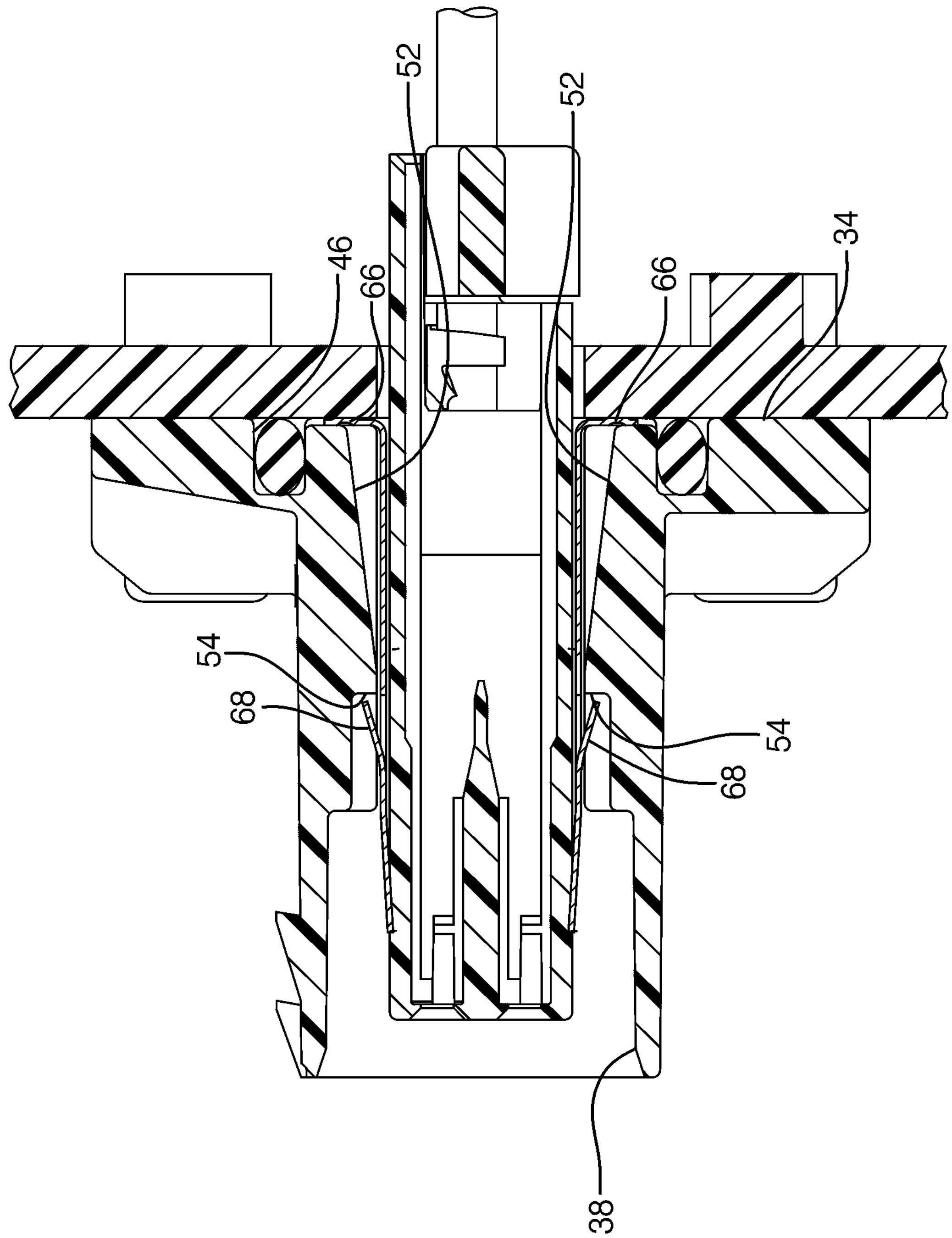
FIG. 3 is a cross section of the electrical connector assembly of FIG. 1 taken through section line 3-3 of FIG. 2.
Figure 4:
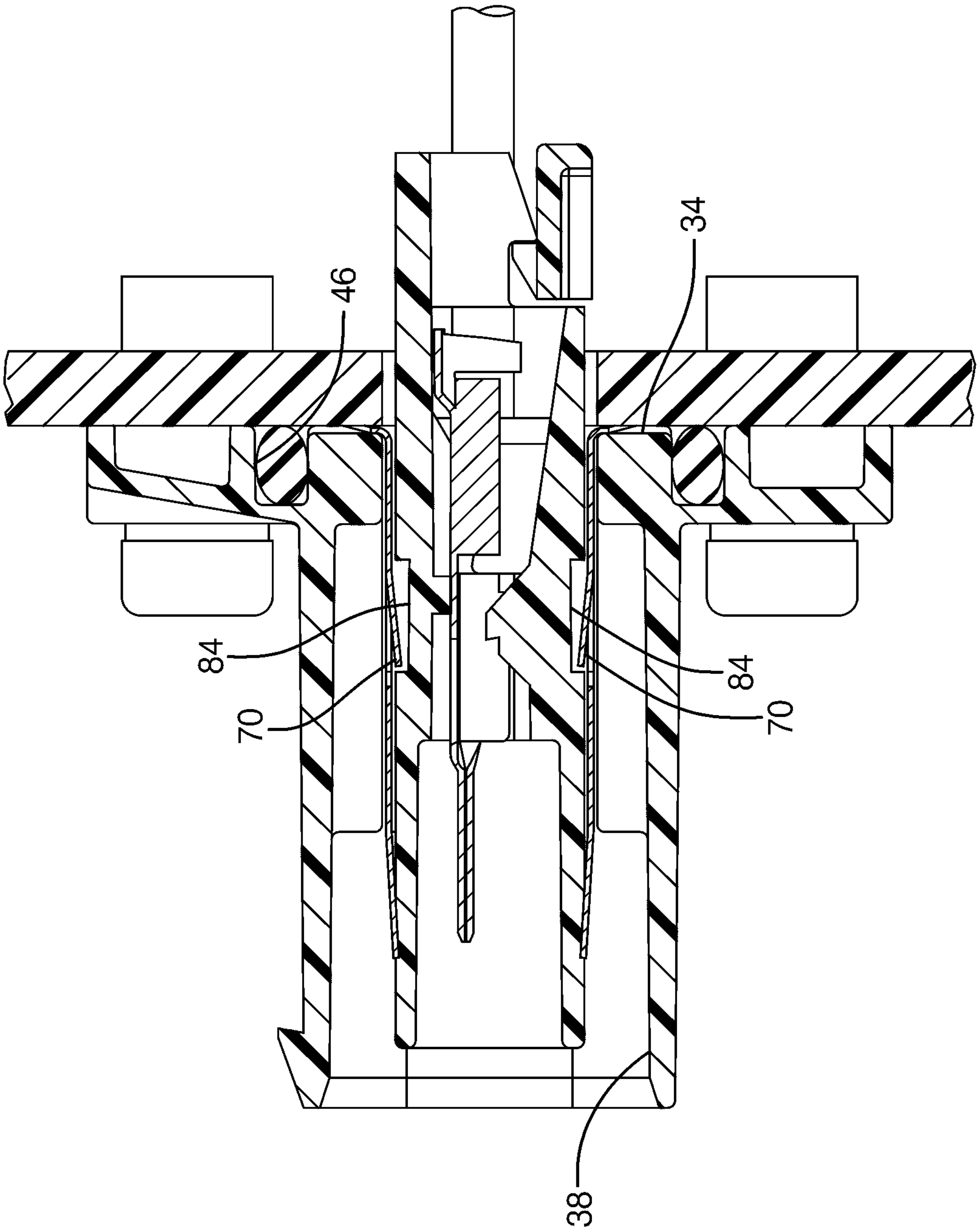
FIG. 4 is a cross section of the electrical connector assembly of FIG. 1 taken through section line 4-4 of FIG. 2.

Referring now to the drawings wherein like reference numerals are used to identify identical components in the various views, FIGS. 1, 1A, 2, 3, and 4 illustrate an exemplary electrical connector assembly 10 which is mounted to a case 12 having an inside surface 14 defining an interior of case 12, an outside surface 16 defining an outside of case 12, and an aperture 18 therethrough providing communication from inside surface 14 to outside surface 16. It should be understood that case 12 may form a fully or substantially enclosed case or may be a wall separating two areas and only a portion of case 12 is shown for clarity. Electrical connector assembly 10 includes an outer connector 20, an inner connector 22, an electromagnetic shield 24, and a seal 26. Electrical connector assembly 10 is configured to receive a mating connector 28 to pass an electrical current or signal from a first device on the interior of case 12 to a second device on the outside of case 12 connected to mating connector 28. Alternatively, the electrical current or signal may pass from the second device to the first device.

Outer connector 20 generally includes an outer connector body 30 extending along an axis A and an outer connector flange 32 extending outward from outer connector body 30 at the end of outer connector body 30 that is proximal to case 12. Outer connector body 30 and outer connector flange 32 together define an outer connector surface 34 of which a portion is mated against outside surface 16 of case 12. An outer connector passage 36 extends through outer connector 20 along axis A to define an outer connector inner wall 38. Outer connector passage 36 has a generally rectangular shape when sectioned by a plane perpendicular to axis A. A plurality of outer connector attachment holes 40 may extend through outer connector flange 32 parallel to axis A. Each outer connector attachment hole 40 may receive a fastener 42 which threadably engages a corresponding threaded hole 44 in case 12 in order to attach outer connector 20, and consequently electrical connector assembly 10, to case 12. Outer connector body 30 and outer connector flange 32 may be integrally formed as a single piece of a plastic material by using a plastic injection molding process. While outer connector flange 32 is illustrated as rectangular, it should be understood that outer connector flange 32 may alternatively take the form of other shapes.

Outer connector surface 34 may include a seal groove 46 therein which surrounds outer connector passage 36 to receive seal 26. Consequently, seal 26 is compressed between seal groove 46 and outside surface 16 of case 12 when outer connector 20 is fastened to case 12 with fasteners 42. In this way, seal 26 reduces or prevents the intrusion of liquid and solid foreign matter from entering case 12 between the interface of outer connector 20 and case 12. Outer connector surface 34 may also include alignment pin 48 extending therefrom in the same direction as axis A. Outside surface 16 of case 12 may have a corresponding alignment hole 50 for receiving alignment pin 48 therein. Alignment pin 48 and alignment hole 50 together assure proper orientation of outer connector 20 to case 12.

A pair of outer connector ramp surfaces 52 may extend inward from outer connector inner wall 38. Outer connecter ramp surfaces 52 may be spaced evenly about outer connector inner wall 38 such that each outer connector ramp surface 52 is spaced 180° from the outer connector ramp surface 52. Outer connector ramp surfaces 52 begin at outer connector surface 34 and extend part way into outer connector passage 36 in the same direction as axis A. Outer ramp surfaces 52 are inclined to axis A such that outer connector ramp surfaces 52 come closer to each other distal from outer connector surface 34. Each outer connector ramp surface 52 terminates at a shoulder 54 which is substantially perpendicular to axis A. The use of outer connector ramp surfaces 52 will be discussed in more detail later.

Electromagnetic shield 24 may be made of a single piece of metallic sheet material by stamping and bending the metallic sheet material into the desired shape and to include the features that will be subsequently described. Alternatively, electromagnetic shield 24 may be made from multiple pieces of metallic sheet material. Electromagnetic shield 24 is formed into a shape that fits closely within outer connector passage 36. As shown, electromagnetic shield 24 is substantially rectangular in shape when sectioned by a plane perpendicular to axis A such that electromagnetic shield 24 includes sides 56*a* and 56*b* which oppose each other and sides 58*a* and 58*b* which oppose each other and are substantially perpendicular to sides 56*a* and 56*b*. Sides 56*a*, 56*b*, 58*a*, and 58*b* together define an electromagnetic shield passage 60 extending through electromagnetic shield 24 in the direction of axis A. A first electromagnetic shield end 62 of electromagnetic shield 24 is positioned proximal to case 12 and outer connector surface 34 while a second electromagnetic shield end 64 terminates electromagnetic shield 24 at the end opposite of first electromagnetic shield end 62.

In order to ensure an adequate electrical ground connection between electromagnetic shield 24 and case 12, electromagnetic shield 24 may include a plurality of ground tabs 66. Ground tabs 66 extend away from first electromagnetic shield end 62 such that ground tabs 66 are sandwiched between outer connector surface 34 and outside surface 16 of case 12 when outer connector 20 is attached to case 12. Alternatively, but not shown, ground tabs 66 may be arranged to make contact with aperture 18 of case 12. Prior to attaching outer connector 20 to case 12, ground tabs 66 may be bent slightly to an angle that is different than the angle ground tabs 66 will take after ground tabs 66 are sandwiched between outer connector surface 34 and outside surface 16 of case 12. This allows ground tabs 66 to act as springs to compress slightly, thereby ensuring an adequate electrical ground connection between electromagnetic shield 24 and case 12.

In order to retain electromagnetic shield 24 within outer connector 20, sides 56*a* and 56*b* of electromagnetic shield 24 may be provided with electromagnetic shield retention tabs 68. Electromagnetic shield retention tabs 68 extend outward from sides 56*a* and 56*b* of electromagnetic shield 24. Electromagnetic shield retention tabs 68 are resiliently hinged with electromagnetic shield 24 to allow a force to compress electromagnetic shield retention tabs 68 inward and to allow electromagnetic shield retention tabs 68 to spring back to position after the force has been removed. Electromagnetic shield retention tabs 68 are hinged on the side thereof that is proximal to second electromagnetic shield end 64. In this way, as electromagnetic shield 24 is inserted into outer connector 20 from the end of outer connector passage 36 that is proximal to outer connector flange 32, outer connector ramp surfaces 52 apply a force to compress electromagnetic shield retention tabs 68 inward. After electromagnetic shield 24 has been inserted sufficiently far into outer connector 20, electromagnetic shield retention tabs 68 will move past outer connector ramp surfaces 52, thereby allowing electromagnetic shield retention tabs 68 to spring outward to engage shoulders 54. In this way, electromagnetic shield retention tabs 68 acting on shoulders 54 prevent removal of electromagnetic shield 24 from outer connector 20. In addition to providing an adequate electrical ground connection between electromagnetic shield 24 and case 12, ground tabs 66 allow electromagnetic shield 24 to be inserted into outer connector 20 only until ground tabs 66 contact outer connector surface 34.

In order to retain inner connector 22 within outer connector 20 and electromagnetic shield 24, sides 56*a* and 56*b* of electromagnetic shield 24 may be provided with inner connector retention tabs 70. Inner connector retention tabs 70 extend inward from sides 56*a* and 56*b* of electromagnetic shield 24. Inner connector retention tabs 70 are resiliently hinged with electromagnetic shield 24 to allow a force to compress inner connector retention tabs 70 outward and to allow inner connector retention tabs 70 to spring back to position after the force has been removed. Inner connector retention tabs 70 are hinged on the side thereof that is proximal to first electromagnetic shield end 62. The function of inner connector retention tabs 70 will be discussed in more detail later.

Inner connector 22 includes an inner connector body 72, electrical terminals 74 with conductors shown as wires 75, and a terminal position assurance (TPA) device 76. Inner connector body 72 is made of a plastic material and may be formed as a single piece by using a plastic injection molding process. Inner connector body 72 includes two inner connector passages 78 that extend through inner connector body 72 in the same direction as axis A. As shown, inner connector body 72 is substantially rectangular in shape when sectioned by a plane perpendicular to axis A such that inner connector body 72 includes sides 80*a* and 80*b* which oppose each other and sides 82*a* and 82*b* which oppose each other and are substantially perpendicular to sides 80*a* and 80*b*. Inner connector body 72 is generally sized to extend through aperture 18 of case 12 and to fit closely within electromagnetic shield 24.

In order to retain inner connector 22 within electromagnetic shield 24, sides 80*a* and 80*b* of inner connector body 72 are provided with inner connector body recesses 84. When inner connector 22 is inserted into aperture 18 of case 12 and electromagnetic shield passage 60, inner connector retention tabs 70 are flexed outward until inner connector retention tabs 70 are aligned with inner connector body recesses 84 at which point the inner connector retention tabs 70 spring inward into inner connector body recesses 84. In this way, inner connector retention tabs 70 acting on inner connector body recesses 84 prevent removal of inner connector 22 from electromagnetic shield 24.

In order to limit how far inner connector 22 is inserted into electromagnetic shield 24 and outer connector 20, inner connector body 72 may include an inner connector stop 86 having an inner connector stop shoulder 88 which is arranged to contact inside surface 14 of case 12 when inner connector 22 has been inserted to the desired depth.

Inner connector body 72 may also include inner connector alignment spline 90 arranged along side 82*a* in the same direction as axis A. Aperture 18 includes an alignment notch 92 which corresponds to inner connector alignment spline 90 for receiving inner connector alignment spline 90 therein. In this way, inner connector alignment spline 90 together with alignment notch 92 assures proper orientation of inner connector 22 with respect to case 12 and outer connector 20.

Wires 75 may be a typical solid or stranded wire with an electrical insulation applied to the outside thereof. Electrical terminals 74 are arranged to crimp a portion of wires 75 thereto which has had the insulation removed in order to provide electrical communication between corresponding electrical terminals 74 and wires 75. One electrical terminal 74 is retained within one inner connector passage 78 by features that will not be further discussed herein while the other electrical terminal 74 is retained within the other inner connector passage 78 by features that will not be further discussed herein.

TPA device 76 is provided to ensure that electrical terminals 74 are inserted sufficiently far into inner connector body 72 and to relieve stress on the crimp connection between terminals 74 and wires 75 by clamping the insulated portion of wire 75 to inner connector body 72. TPA device 76 includes TPA latches 94 which are arrange to lock into inner connector body latch receivers 96 (only one is visible in FIG. 1) on inner connector body 72 only when electrical terminals 74 are inserted to the proper depth within their respective inner connector passages 78. When TPA latches 94 lock into inner connector body latch receivers 96, an insulated portion of wires 75 is clamped securely between TPA device 76 and inner connector body 72. In this way, any force on wires 75 attempting to pull wires 75/electrical terminals 74 out of inner connector body 72 will not put a strain on the crimp connection between electrical terminals 74 and wires 75.

Figure 5:
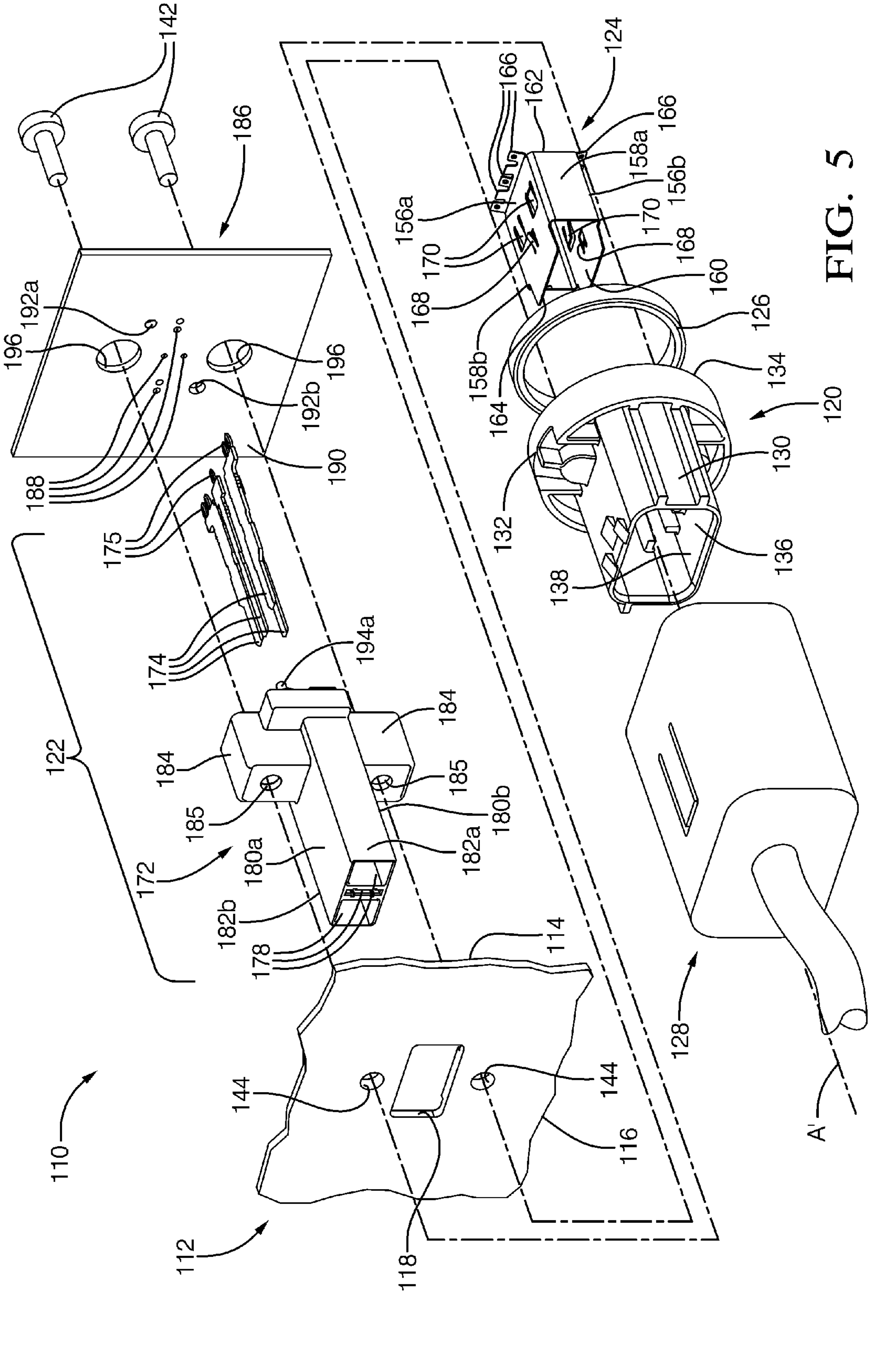
FIG. 5 an isometric exploded view of an electrical connector assembly in accordance with a second embodiment of the present invention.
Figure 5A:
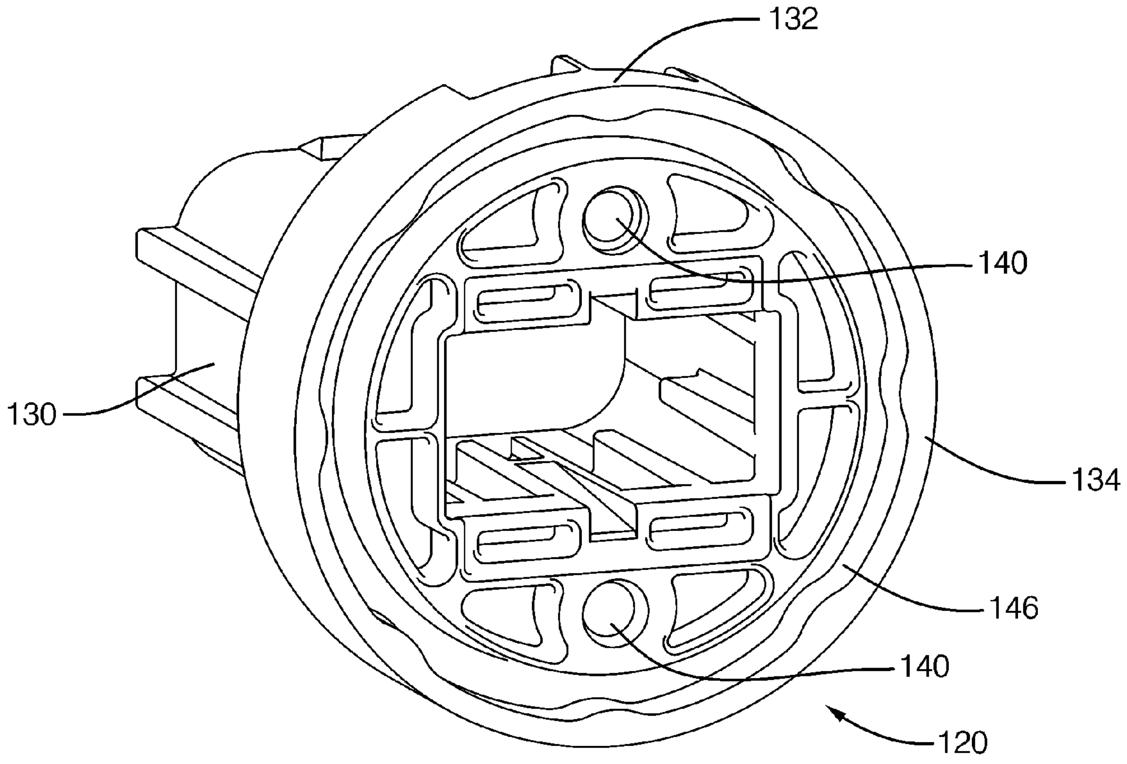
FIG. 5A is an isometric view of an outer connector of the electrical connector assembly of FIG. 5.
Figure 5B:
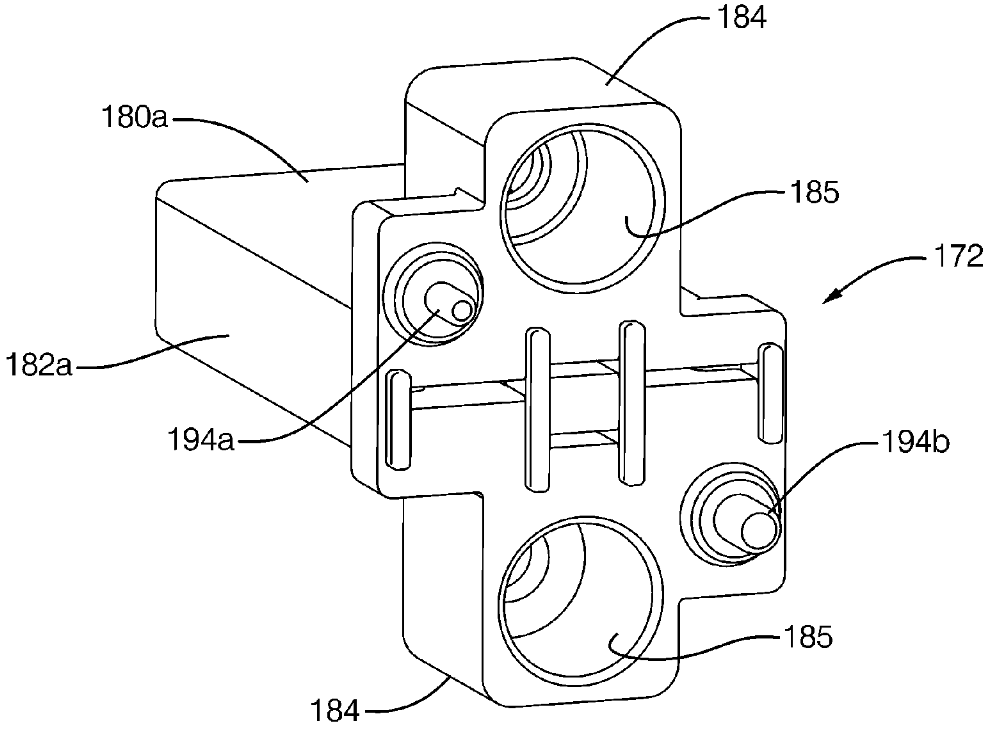
FIG. 5B is an isometric view of an inner connector of the electrical connector assembly of FIG. 5.
Figure 6:
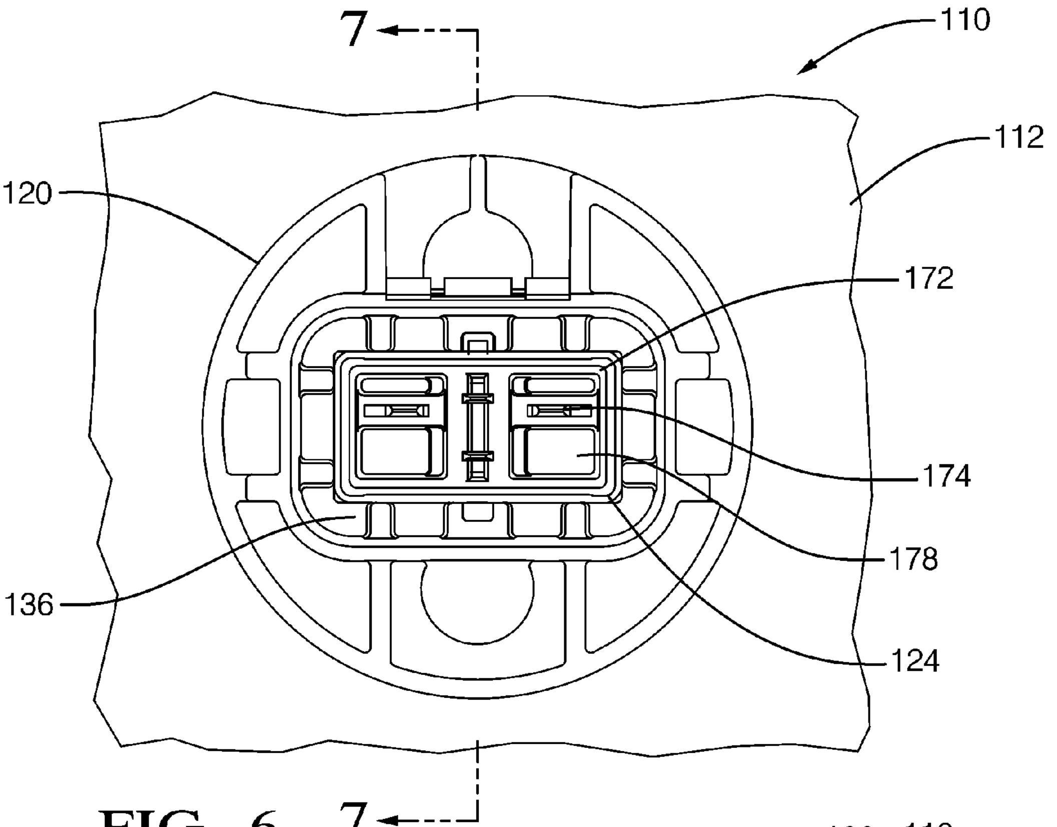
FIG. 6 is an elevation view of the electrical connector assembly of FIG. 5.
Figure 7:
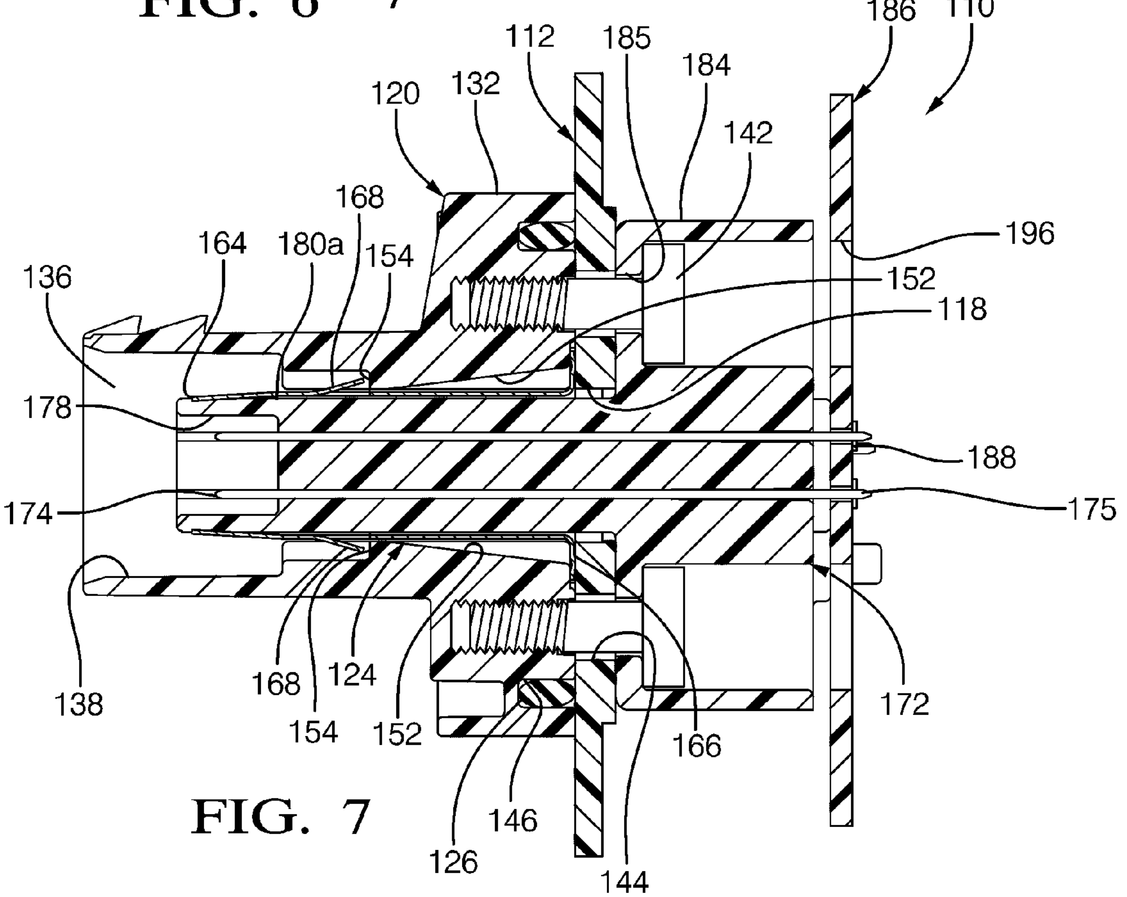
FIG. 7 is a cross section of the electrical connector assembly of FIG. 5 taken through section line 7-7 of FIG. 6.

Reference will now be made to FIGS. 5, 5A, 5B, 6, and 7 which illustrate a second exemplary electrical connector assembly 110 which is mounted to a case 112 having an inside surface 114 defining an interior of case 112, an outside surface 116 defining an outside of case 112, and an aperture 118 therethrough providing communication from inside surface 114 to outside surface 116. It should be understood that case 112 may form a fully or substantially enclosed case or may be a wall separating two areas and only a portion of case 112 is shown for clarity. Electrical connector assembly 110 includes an outer connector 120, an inner connector 122, an electromagnetic shield 124, and a seal 126. Electrical connector assembly 110 is configured to receive a mating connector 128 to pass an electrical current or signal from a first device on the interior of case 112 to a second device on the outside of device 112 connected to mating connector 128. Alternatively, the electrical current or signal may pass from the second device to the first device.

Outer connector 120 generally includes an outer connector body 130 extending along an axis A' and an outer connector flange 132 extending outward from outer connector body 130 at the end of outer connector body 130 that is proximal to case 112. Outer connector body 130 and outer connector flange 132 together define an outer connector surface 134 of which a portion is mated against outside surface 116 of case 112. An outer connector passage 136 extends through outer connector 120 along axis A' to define an outer connector inner wall 138. Outer connector passage 136 has a generally rectangular shape when sectioned by a plane perpendicular to axis A'. A plurality of outer connector attachment holes 140 may extend into outer connector flange 132 from outer connector surface 134 and parallel to axis A'. Each outer connector attachment hole 140 may threadably receive a fastener 142 which passes through a hole 144 in case 112 in order to attach outer connector 120, and consequently electrical connector assembly 110, to case 112. The attachment of outer connector 120 to case 112 using fasteners 142 will be discussed in more detail later. Outer connector body 130 and outer connector flange 132 may be integrally formed as a single piece of a plastic material by using a plastic injection molding process. While outer connector flange 132 is illustrated as circular, it should be understood that outer connector flange 132 may alternatively take the form of other shapes.

Outer connector surface 134 may include a seal groove 146 therein which surrounds outer connector passage 136 to receive seal 126. Consequently, seal 126 is compressed between seal groove 146 and outside surface 116 of case 112 when outer connector 120 is fastened to case 112 with fasteners 142. In this way, seal 126 reduces or prevents the intrusion of liquid and solid foreign matter from entering case 112 between the interface of outer connector 120 and case 112. While not shown in FIGS. 5, 5A, 5B, 6, and 7, outer connector 120 may include an alignment pin similar to that of outer connector 20 and case 112 may have a corresponding alignment hole similar to that of case 12 in order to orient outer connector 120 to case 112. It should be understood that other features may be used orient outer connector 120 to case 112.

A pair of outer connector ramp surfaces 152 may extend inward from outer connector inner wall 138. Outer connecter ramp surfaces 152 may be spaced evenly about outer connector inner wall 138 such that each outer connector ramp surface 152 is spaced 180° from the other connector ramp surface 152. Outer connector ramp surfaces 152 begin at outer connector surface 134 and extend part way into outer connector passage 136 in the same direction as axis A'. Outer ramp surfaces are inclined to axis A' such that outer connector ramp surfaces 152 come closer to each other distal from outer connector surface 134. Each outer connector ramp surface 152 terminates at a shoulder 154 which is substantially perpendicular to axis A'. The use of outer connector ramp surfaces 152 will be discussed in more detail later.

Electromagnetic shield 124 may be made of a single piece of metallic sheet material by stamping and bending the metallic sheet material into the desired shape and to include the features that will be subsequently described. Alternatively, electromagnetic shield 124 may be made from multiple pieces of metallic sheet material. Electromagnetic shield 124 is formed into a shape that fits closely within outer connector passage 136. As shown, electromagnetic shield 124 is substantially rectangular in shape when sectioned by a plane perpendicular to axis A' such that electromagnetic shield 124 includes sides 156*a* and 156*b* which oppose each other and sides 158*a* and 158*b* which oppose each other and are substantially perpendicular to sides 156*a* and 156*b*. Sides 156*a*, 156*b*, 158*a*, and 158*b* together define an electromagnetic shield passage 160 extending through electromagnetic shield 124 in the direction of axis A'. A first electromagnetic shield end 162 of electromagnetic shield 124 is positioned proximal to case 112 and outer connector surface 134 while a second electromagnetic shield end 164 terminates electromagnetic shield 124 at the end opposite of first electromagnetic shield end 162.

In order to ensure an adequate electrical ground connection between electromagnetic shield 124 and case 112, electromagnetic shield 124 may include a plurality of ground tabs 166. Ground tabs 166 extend away from first electromagnetic shield end 162 such that ground tabs 166 are sandwiched between outer connector surface 134 and outside surface 116 of case 112 when outer connector 120 is attached to case 112. Alternatively, but not shown, ground tabs 166 may be arranged to make contact with aperture 118 of case 112. Prior to attaching outer connector 120 to case 112, ground tabs 166 may be bent slightly to an angle that is different than the angle ground tabs 166 will take after ground tabs 166 are sandwiched between outer connector surface 134 and outside surface 116 of case 112. This allows ground tabs 166 to act as springs to compress slightly, thereby ensuring an adequate electrical ground connection between electromagnetic shield 124 and case 112.

In order to retain electromagnetic shield 124 within outer connector 120, sides 156*a* and 156*b* of electromagnetic shield 124 may be provided with electromagnetic shield retention tabs 168. Electromagnetic shield retention tabs 168 extend outward from sides 156*a* and 156*b* of electromagnetic shield 124. Electromagnetic shield retention tabs 168 are resiliently hinged with electromagnetic shield 124 to allow a force to compress electromagnetic shield retention tabs 168 inward and to allow electromagnetic shield retention tabs 168 to spring back to position after the force has been removed. Electromagnetic shield retention tabs 168 are hinged on the side thereof that is proximal to second electromagnetic shield end 164. In this way, as electromagnetic shield 124 is inserted into outer connector 120 from the end of outer connector passage 136 that is proximal to outer connector flange 132, outer connector ramp surfaces 152 apply a force to compress electromagnetic shield retention tabs 168 inward. After electromagnetic shield 124 has been inserted sufficiently far into outer connector 120, electromagnetic shield retention tabs 168 will move past outer connector ramp surfaces 152, thereby allowing electromagnetic shield retention tabs 168 to spring outward to engage shoulders 154. In this way, electromagnetic shield retention tabs 168 acting on shoulders 154 prevent removal of electromagnetic shield 124 from outer connector 120. In addition to providing an adequate electrical ground connection between electromagnetic shield 124 and case 112, ground tabs 166 allow electromagnetic shield 124 to be inserted into outer connector 120 only until ground tabs 166 contact outer connector surface 134.

In order to center inner connector 122 within electromagnetic shield 124, sides 156*a* and 156*b* of electromagnetic shield 124 may be provided with inner connector centering tabs 170. Inner connector centering tabs 170 extend inward from sides 156*a* and 156*b* of electromagnetic shield 124. Inner connector centering tabs 170 are resiliently hinged with electromagnetic shield 124 to allow a force to compress inner shield centering tabs 170 outward. Inner connector centering tabs 170 are hinged on the side thereof that is proximal to first electromagnetic shield end 162. Inner connector centering tabs 170 will be discussed in more detail later.

Inner connector 122 includes an inner connector body 172 and electrical terminals 174 with conductors shown as compliant pin terminals 175. As shown, each electrical terminal 174 may be integrally formed as a single piece with a corresponding compliant pin terminal 175. Inner connector body 172 is made of a plastic material and may be formed as a single piece by using a plastic injection molding process. Inner connector body 172 includes inner connector passages 178 that extend into inner connector body 172 in the same direction as axis A' from the end of inner connector body 172 that is inserted into outer connector 120. As shown, inner connector body 172 is substantially rectangular in shape when sectioned by a plane perpendicular to axis A' such that inner connector body 172 includes sides 180*a* and 180*b* which oppose each other and sides 182*a* and 182*b* which oppose each other and are substantially perpendicular to sides 180*a* and 180*b*. Inner connector body 172 is generally sized to extend through aperture 118 of case 112 and to fit closely within electromagnetic shield 124.

Each electrical terminal 174 extends into one respective inner connector passage 178 such that each compliant pin terminal 175 extends outward from the end of inner connector body 172 that is distal from inner connector passages 178. Electrical terminals 174 may be retained within inner connector body 172 by a press fit relationship or by being overmolded within inner connector body 172 in an over-molding operation which simultaneously forms inner connector body 172 with electrical terminals 174 molded therein.

In order to retain inner connector 122 within electromagnetic shield 124, sides 180*a* and 180*b* of inner connector body 172 are provided with inner connector body flanges 184 that extend outward from respective sides 180*a* and 180*b* of inner connector body 172. Inner connector body flanges 184 may be integrally formed as a single piece with inner connector body 172. Each inner connector body flange 184 includes an inner connector body flange hole 185 to allow fasteners 142 to pass therethrough. When inner connector 122 is inserted into aperture 118 of case 112 and electromagnetic shield passage 160, inner connector centering tabs 170 are flexed outward, thereby centering inner connector 122 within electromagnetic shield 124. Fasteners 142 may then be inserted through inner connector body flange holes 155 and holes 144 of case 112 to threadably engage outer connector attachment holes 140. In this way, fasteners 142 clamp inner connector 122, case 112, and outer connector 120 together. It should now be understood that inner connector body flanges 184 limit how far inner connector 22 is inserted into electromagnetic shield 124 and outer connector 120 by abutting inside surface 114 of case 112.

Inner connector 122 may be attached to a printed circuit board (PCB) 186 having a plurality of electrical contacts 188 which make contact with compliant pin terminals 175 for electrical communication therewith. PCB 186 includes PCB substrate 190 onto which electrical contacts 188 are printed. PCB substrate 190 may include PCB mounting holes 192*a* and 192*b* which are used to attach PCB 186 to inner connector 122. As shown, PCB mounting hole 192*a* is smaller in diameter than PCB mounting hole 192*b*. Inner connector body 172 includes PCB mounting pins 194*a* and 194*b* that extend from inner connector body 172 in the same direction as axis A'. Mounting pins 194*a* and 194*b* are sized and spaced to pass through PCB mounting holes 192*a* and 192*b* respectively. In this way, PCB 186 is oriented with respect to inner connector 122. In order to secure PCB 186 to inner connector 122, the portion of mounting pins 194*a* and 194*b* that protrude through PCB mounting holes 192*a* and 192*b* may be melted to form a head that is larger in diameter than PCB mounting holes 192*a* and 192*b*. PCB substrate 190 also includes clearance holes 196 that are aligned with inner connector body flange holes 185 and sized to prevent interference with fasteners 142. Although not shown, it should be understood that PCB 186 may also include various electronic components, for example only, resisters, capacitors, and diodes that may be connected to electrical contacts 188. When PCB 186 is assembled to inner connector 122, compliant pin terminals 175 make electrical contact with the desired electrical contacts 188. While electrical communication from electrical terminals 174 to PCB 186 is shown as being made with compliant pin terminals 175 and electrical contacts 188, it should now be understood that soldered thru holes/terminals or other common methods would be applicable.

Figure 8:
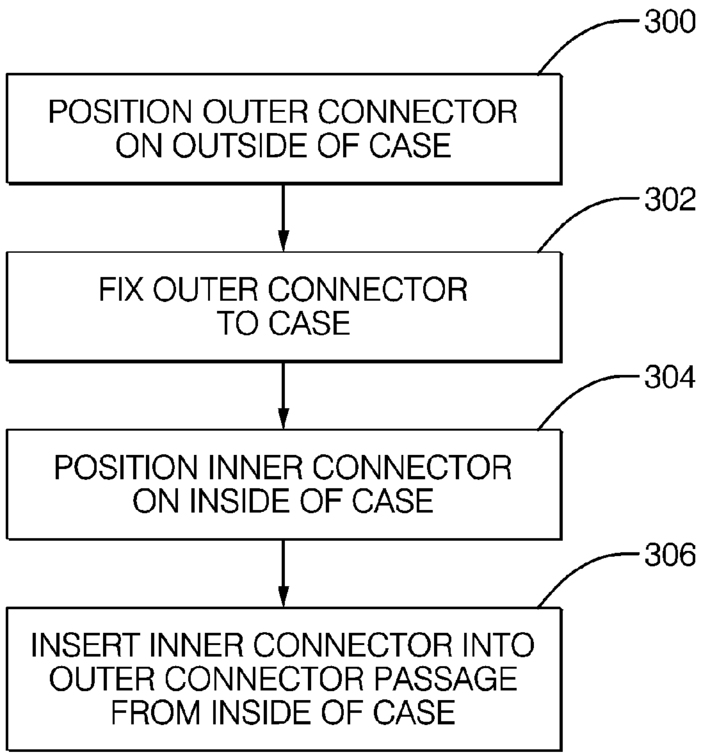
FIG. 8 is a method of assembling the electrical connector assembly of FIG. 1.

A method for assembling electrical connector assembly 10 will now be described with reference to FIGS. 1, 1A, 2, 3, 4 and 8. In accordance with the method, outer connector 20 is positioned on the outside of case 12 to align outer connector passage 36 with aperture 18 of case 12 as shown is step 300 of FIG. 8. In this step, seal 26 may already be assembled within seal groove 46 and electromagnetic shield 24 may already be fixed within outer connector passage 36. Outer connector 20 may fixed to case 12 as shown in step 302 of FIG. 8. Inner connector 22 is positioned on the inside of case 12 as shown in step 304 of FIG. 8. It should now be understood that although step 304 is illustrated as occurring subsequent to step 300, steps 300 and 304 may occur simultaneously. It should also now be understood that step 304 may occur prior to step 300. After steps 300 and 304 are complete, inner connector 22 is inserted into outer connector passage 36 through aperture 18 from inside case 12 as shown in step 306. It should now be understood that although step 302 is illustrated as occurring prior to steps 304 and 306, it should now be understood that step 302 may occur subsequent to one or both of steps 304 and 306. As described previously, outer connector flange 32 and fasteners 42 are used to fix outer connector 20 to case 12.

Figure 9:
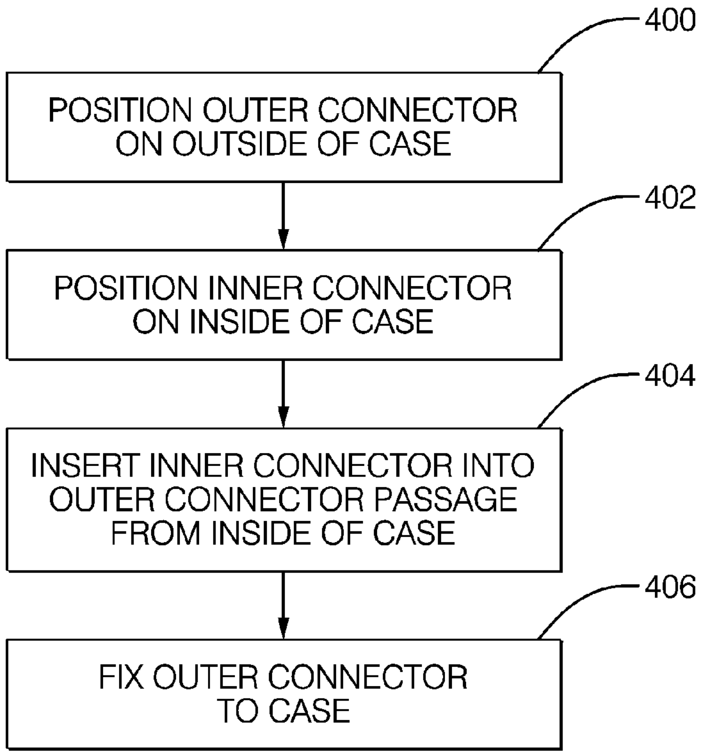
FIG. 9 is a method of assembling the electrical connector assembly of FIG. 5.

A method for assembling connector assembly 110 will now be described with reference to FIGS. 5, 5A, 5B, 6, 7, and 9. In accordance with the method, outer connector 120 is positioned on the outside of case 112 to align outer connector passage 136 with aperture 118 of case 112 as shown is step 400 of FIG. 9. In this step, seal 126 may already be assembled within seal groove 146 and electromagnetic shield 124 may already be fixed within outer connector passage 136. Inner connector 122, with PCB 186 attached thereto, is positioned on the inside of case 12 as shown in step 402 of FIG. 9. It should now be understood that although steps 400 and 402 are illustrated as occurring sequentially, steps 400 and 402 may occur simultaneously. It should also now be understood that step 402 may occur prior to step 400. After steps 400 and 402 are complete, inner connector 122 is inserted into outer connector passage 136 through aperture 118 from inside case 112 as shown in step 404. In accordance with the method, outer connector 120 is fixed to case 112 as shown in step 406. As described previously, outer connector flange 132 and fasteners 142 are used to fix outer connector 120 to case 112.

While this invention has been described in terms of preferred embodiments thereof, it is not intended to be so limited, but rather only to the extent set forth in the claims that follow.

We claim:

1. A method for assembling an electrical connector assembly to a case having an inside surface defining an inside of said case, an outside surface defining an outside of said case, and an aperture therethrough providing communication from said inside surface to said outside surface; said electrical connector assembly having an outer connector having a body with a passage therethrough, an electromagnetic shield, and an inner connector with a terminal therein with a conductor extending from said inner connector in electrical communication with said terminal; said method comprising the steps of:

positioning said outer connector on said outside of said case to align said passage of said outer connector with said aperture of said case;

positioning said inner connector on said inside of said case; and inserting said inner connector into said passage of said outer connector through said aperture from said inside of said case;

positioning said electromagnetic shield within said passage of said outer connector;

surrounding said inner connector with said electromagnetic shield;

fixing said inner connector to said case; and fixing said outer connector to said case, wherein said inner connector includes a flange extending outward therefrom, and said step of fixing said inner connector to said case uses said flange of the inner connector to fix said inner connector to said case, wherein said step of fixing said inner connector to said case and said step of fixing outer connector to said case are performed simultaneously and wherein said outer connector includes a flange extending outward therefrom, and said step of fixing said outer connector to said case uses said flange of the outer connector to fix said outer connector to said case.

2. The method according to claim 1, wherein said step of positioning said electromagnetic shield within said passage of said outer connector is performed prior to said step of positioning said outer connector on said outside of said case to align said passage of said outer connector with said aperture of said case.

3. The method according to claim 2, wherein said step of inserting said inner connector into said passage of said outer connector from said inside of said case and said step of surrounding said inner connector with said electromagnetic shield are performed simultaneously.

4. A method for assembling an electrical connector assembly to a case having an inside surface defining an inside of said case, an outside surface defining an outside of said case, and an aperture therethrough providing communication from said inside surface to said outside surface; said electrical connector assembly having an outer connector having a body with a passage therethrough, an electromagnetic shield, and an inner connector with a terminal therein with a conductor extending from said inner connector in electrical communication with said terminal; said method comprising the steps of:

positioning said outer connector on said outside of said case to align said passage of said outer connector with said aperture of said case;

positioning said inner connector on said inside of said case; and inserting said inner connector into said passage of said outer connector through said aperture from said inside of said case;

positioning said electromagnetic shield within said passage of said outer connector;

surrounding said inner connector with said electromagnetic shield;

fixing said inner connector to said case;

providing a printed circuit board having a circuit printed thereon;

electrically connecting said terminal to said circuit; and
fixing said inner connector to said printed circuit board.

5. The method according to claim 4, wherein said step of fixing said inner connector to said printed circuit board is performed prior to said step of fixing said inner connector to said case.

6. A method for assembling an electrical connector assembly to a case having an inside surface defining an inside of said case, an outside surface defining an outside of said case, and an aperture therethrough providing communication from said inside surface to said outside surface; said electrical connector assembly having an outer connector having a body with a passage therethrough, an electromagnetic shield, and an inner connector with a terminal therein with a conductor extending from said inner connector electrical communication with said terminal; said method comprising the steps of:

positioning said outer connector on said outside of said case to align said passage of said outer connector with said aperture of said case;

positioning said inner connector on said inside of said case;

inserting said inner connector into said passage of said outer connector through said aperture from said inside of said case; and comprising fixing said outer connector to said case, wherein said step of positioning said electromagnetic shield within said passage of said outer connector is performed prior to said step of positioning said outer connector on said outside of said case to align said passage of said outer connector with said aperture of said case and wherein said outer connector includes a flange extending outward therefrom, and said step of fixing said outer connector to said case uses said flange of the outer connector to fix said outer connector to said case.

7. A method for assembling an electrical connector assembly to a case having an inside surface defining an inside of said case, an outside surface defining an outside of said case, and an aperture therethrough providing communication from said inside surface to said outside surface; said electrical connector assembly having an outer connector having a body with a passage therethrough, an electromagnetic shield, and an inner connector with a terminal therein with a conductor extending from said inner connector in electrical communication with said terminal; said method comprising the steps of:

positioning said outer connector on said outside of said case to align said passage of said outer connector with said aperture of said case;

positioning said inner connector on said inside of said case;

inserting said inner connector into said passage of said outer connector through said aperture from said inside of said case; and positioning said electromagnetic shield within said passage of said outer connector, wherein said step of surrounding said inner connector with said electromagnetic shield is performed prior to said step of positioning said electromagnetic shield within said passage of said outer connector.

8. The method according to claim 7, wherein said step of inserting said inner connector into said passage of said outer connector and said step of positioning said electromagnetic shield within said passage of said outer connector are performed simultaneously.

* * * * *